United States Patent
Nakagaki

(10) Patent No.: US 8,331,159 B2
(45) Date of Patent: Dec. 11, 2012

(54) NONVOLATILE SEMICONDUCTOR MEMORY DEVICE AND DISCHARGE CIRCUIT THEREOF

(75) Inventor: Yuichiro Nakagaki, Yokohama (JP)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 290 days.

(21) Appl. No.: 12/816,410

(22) Filed: Jun. 16, 2010

(65) Prior Publication Data

US 2010/0329035 A1    Dec. 30, 2010

(30) Foreign Application Priority Data

Jun. 26, 2009  (JP) ................................ 2009-152819
Apr. 22, 2010  (KR) ........................ 10-2010-0037544

(51) Int. Cl.
*G11C 11/34* (2006.01)

(52) U.S. Cl. ......... 365/185.25; 365/185.01; 365/185.05; 365/185.18; 365/185.27; 365/189.09; 365/204

(58) Field of Classification Search ............. 365/185.01, 365/185.05, 185.18, 185.25, 185.27, 189.09, 365/204

See application file for complete search history.

(56) References Cited

U.S. PATENT DOCUMENTS

| 2002/0159298 A1* | 10/2002 | Hirano ..................... 365/185.29 |
| 2006/0034140 A1* | 2/2006 | Ogawa et al. ............ 365/230.03 |
| 2009/0063918 A1* | 3/2009 | Chen et al. .................... 714/721 |

FOREIGN PATENT DOCUMENTS

| JP | 2001-351390 | 12/2001 |
| JP | 2002-261172 | 9/2002 |
| JP | 2005-310301 | 11/2005 |
| JP | 2008-004236 | 1/2008 |

* cited by examiner

*Primary Examiner* — Fernando Hidalgo
(74) *Attorney, Agent, or Firm* — Volentine & Whitt, PLLC

(57) ABSTRACT

A discharge circuit for a floating gate type MOS memory cell transistor disposed in a memory array region of a nonvolatile semiconductor memory device, the memory cell region being formed in P-well, the P-well being formed in an N-well, and the N-well being formed in a P-type semiconductor substrate, includes a word line discharge circuit providing a word line control voltage and a bulk discharge circuit providing a voltage to the P-well during a discharge operation. Constant current transistors and switching transistors in the word line discharge circuit and the bulk discharge circuit are simultaneously turned ON during at least a portion of the discharge operation.

12 Claims, 8 Drawing Sheets

NONVOLATILE SEMICONDUCTOR MEMORY DEVICE AND DISCHARGE CIRCUIT THEREOF

CROSS-REFERENCE TO RELATED APPLICATIONS

A claim of priority under 35 U.S.C. §119 is made to Japanese Patent Application No. 10-2009-0152819, filed on Jun. 26, 2009, the entire contents of which are hereby incorporated by reference. A claim of priority under 35 U.S.C. §119 is also made to Korean Patent Application No. 10-2010-0037544, filed on Apr. 22, 2010.

BACKGROUND

The present disclosure herein relates to a semiconductor memory device, and more particularly, to a discharge circuit which discharges terminals of a memory array of a nonvolatile semiconductor memory device.

In nonvolatile semiconductor memory devices, an example of which is a flash memory, device operations generally include a write operation for writing information in memory cells, a read operation for reading written information from the memory cells, and an erase operation for erasing memory cells to allow execution of a new write operation (i.e., rewrite operation).

The erase operation includes a discharge process which is executed after memory cells are erased.

FIG. 7 is a schematic block diagram illustrating a nonvolatile semiconductor memory device disclosed in Japanese Patent Publication No. 10-2002-0261172 (the JP '172 reference).

Referring to FIG. 7, each of a plurality of floating gate type MOS transistors Tr arranged in an array includes a source 13, a drain 14, a floating gate 16, and a control gate 18. Herein, the source 13 and the drain 14 are formed in a P-well 12 that is disposed in the N-well of the P-type semiconductor substrate 10, and the floating gate 16 is formed by fabricating a tunnel oxide layer 15 as a dielectric on the source 13 and the drain 14. The control gate 18 is formed by fabricating an interlayer dielectric 17 as a dielectric on the floating gate 16.

In a voltage condition during execution of an erase operation of the floating gate type MOS transistor Tr, the drain 14 has an opened state, and a first voltage (for example, 6 V) is applied to the P-well 12. At this point, a voltage of 9V is applied to the control gate 18 and simultaneously a second voltage (for example, 9 V) is applied to the N-well 11. Based on this voltage condition, electrons are detached from the floating gate 16, and thus the threshold voltage of the floating gate type MOS transistor Tr becomes low. An erase circuit for realizing the voltage conditions of the erase operation includes a negative voltage pump circuit 3 for applying a negative voltage to a word line WD through a row decoder circuit RD. In addition, the erase circuit includes a first high voltage pump circuit 1 for applying a voltage of 6 V to the P-well 12, and a second high voltage pump circuit 2 for applying a voltage of 9 V to the N-well 11.

When the application of a pulse is ended, an operation is performed which recovers the voltage of the P-well 12 and the voltage of the word line WD to a reference voltage (Vss) (for example, 0 V). The signal of a P-well switch 4 has a low level, the word line WD is forced into the reference voltage (Vss), and the P-well 12 is forced into the reference voltage (Vss). FIG. 8 is a diagram illustrating an example of a voltage waveform of the word line WD, a voltage waveform of the N-well 11 and a voltage waveform of the P-well 12. In a section where the voltage of the word line WD is forced from a voltage of −9 V into the reference voltage (Vss), the voltage of the P-well 12 is boosted from 6 V by about 2 V to become about 8 V and is forced into the reference voltage (Vss). At this point, since the N-well 11 is coupled to the P-well 12, the voltage of the P-well 12 is shifted from 6 V to 8 V, but the voltage of the N-well 11 is shifted from 9 V to 10 V.

In this way, since the voltage of the N-well 11 is always higher than that of the P-well 12, a forward current from the P-well 12 to the N-well 11 does not flow. As a result, the occurrence of latchup condition can be avoided. In a discharge process after erasure in FIG. 8, however, while the voltage of the word line WD is forced into the reference voltage (Vss), since the voltage of the P-well 12 is boosted through coupling and is forced into the reference voltage (Vss), the time necessary for discharge becomes longer to about 500 ns.

Japanese Patent Publication No. 10-2005-0310301 (the JP '301 reference) discloses a nonvolatile semiconductor memory device that includes a nonvolatile memory cell, a word line, a first charge pump circuit, and a discharge circuit. The nonvolatile memory cell includes a first MOS transistor. The word line is connected to the nonvolatile memory cell and the control gate of the first MOS transistor that is disposed on the same line with the nonvolatile memory cell. The first charge pump circuit is activated when data is written or erased to/from the memory cell and generates a first voltage to supply the first voltage to the word line. A discharge circuit discharges an electric charge, which is generated by the first charge pump circuit, to a ground potential terminal or a power source potential terminal while flowing a current in a first voltage node when the first charge pump circuit is deactivated.

For a reset operation after the end of an erase operation, in a state where the potential of a node VDDW is maintained to a voltage VPP, the potential of a node VNEG is again shifted to 0 V and thereby the node VNEG is set to 0 V, and the potential of the node VDDW is set to a voltage Vcc2 and then is set to 0 V, thereby decreasing the effect of a coupling noise. Herein, the node VNEG is set to 0 V, and thereafter, the potential of the node VDDW is set to the voltage Vcc2 and then is set to 0 V. Consequently, it is estimated that technique of the JP '301 reference requires a discharge time longer than the discharge time of 500 ns necessary for a discharge process as in the JP '172 reference.

Japanese Patent Publication No. 10-2001-0351390 discloses an erase circuit control device of a flash memory including a common discharge circuit that electrically and directly connects a gate to at least one of a substrate, a source and a drain which configure cells MC00 to MCmm forming the cell array of a flash memory circuit, during an erase operation.

In an operation executed when erasure has ended, a discharge control signal is shifted from an L level to an H level and thus all N-type MOSFETs of a discharge control circuit are turned on. Therefore, the source CSL, substrate CWL, drain CBL and node Vneg that are electrically connected to the respective contact points of the source, substrate, drain and gate of a memory cell is connected to a common discharge contact point and thereby an N-type MOSFET is turned on, and thus a current path between the common discharge contact point and a ground potential is secured. In this way, since a terminal having a positive potential and a terminal having a negative potential are shorted through a switch, it is difficult to control a discharge time, and thus the withstanding voltage of a device configuring the switch is required to become high. Moreover, a switch size is required to be enlarged in accordance with an element for discharge.

In Japanese Patent Publication No. 10-2008-0004236, disclosed is an erase discharge method of a nonvolatile semiconductor memory device that includes a first step, a second step and a third step. The first step performs an erase operation that applies a first voltage to a word line, applies a second voltage to an N-well and a P-well, opens a bit line and a ground line, and detaches electric charges, which are accumulated in the floating gate of a floating gate type Field Effect Transistor (FET), from a semiconductor substrate. The second step shifts the potential of the word line and the potential of the bit line to a ground potential, discharges electric charges that are accumulated in the word line, and turns on a discharge transistor that is connected to the bit line. The third step shifts the potential of the N-well and the potential of the P-well to a ground potential, and discharges electric charges that are accumulated in the N-well and the P-well.

The second step connects a discharge transistor 1 to a bit line and discharges the bit line simultaneously with the discharge of the word line, and thus prevents the overshooting of the bit line through capacitive coupling between the word line and the bit line. In this way, for preparing a discharge circuit for preventing the voltage of the bit line from rising through coupling in bit line units or in each local bit line of a memory array, the complexity of a circuit increases and simultaneously the manufacturing cost inevitably rises.

SUMMARY

Embodiments of the inventive concepts provide a discharge circuit of nonvolatile semiconductor memory device which includes a memory array region including a plurality of floating gate type MOS memory cell transistors each including a source, a drain and a control gate which are formed in a P-well, where the P-well is formed in an N-well of a P-type semiconductor substrate. The discharge circuit further includes a plurality of terminals formed in the memory array region, and respectively connected to the control gate, the P-well and the N-well, a plurality of constant current transistors respectively connected to the plurality of terminals, and a plurality of switching transistors respectively connected to the plurality of constant current transistors. The respective constant current transistors and switching transistors are turned on at a same timing during a discharge operation.

In other embodiments of the inventive concepts, a discharge circuit of nonvolatile semiconductor memory device performs a discharge operation after an erase operation of the nonvolatile semiconductor memory device. The discharge circuit includes a memory array region including a plurality of floating gate type MOS memory cell transistors each comprising a source, a drain and a control gate which are formed in a P-well, where the P-well is formed in an N-well of a P-type semiconductor substrate. The discharge circuit further includes a plurality of terminals formed in the memory array region, and respectively connected to the control gate and the P-well, first and second switching transistors respectively connected to the constant current transistors, and a third switching transistor connected between the P-well and the N-well. Each of the constant current transistors and first through third switching transistors are turned on at a same timing during the discharge operation.

In other embodiments of the inventive concepts, a nonvolatile semiconductor memory device includes a plurality of memory cells each including a drain and a source formed in a P-well, wherein the P-well is formed in an N-well, a sub-discharge circuit connected to a terminal of the N-well, a bulk discharge circuit connected to a terminal of the P-well, and a word line discharge circuit connected to a word line of the memory cell. The sub-discharge circuit, the bulk discharge circuit and the word line discharge circuit respectively discharge the N-well, the P-well and the word line to a corresponding constant current during a same timing period.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts. In the drawings.

DETAILED DESCRIPTION OF THE EMBODIMENTS

Exemplary embodiments of the inventive concepts will be described below in more detail with reference to the accompanying drawings. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art.

Figure 1:
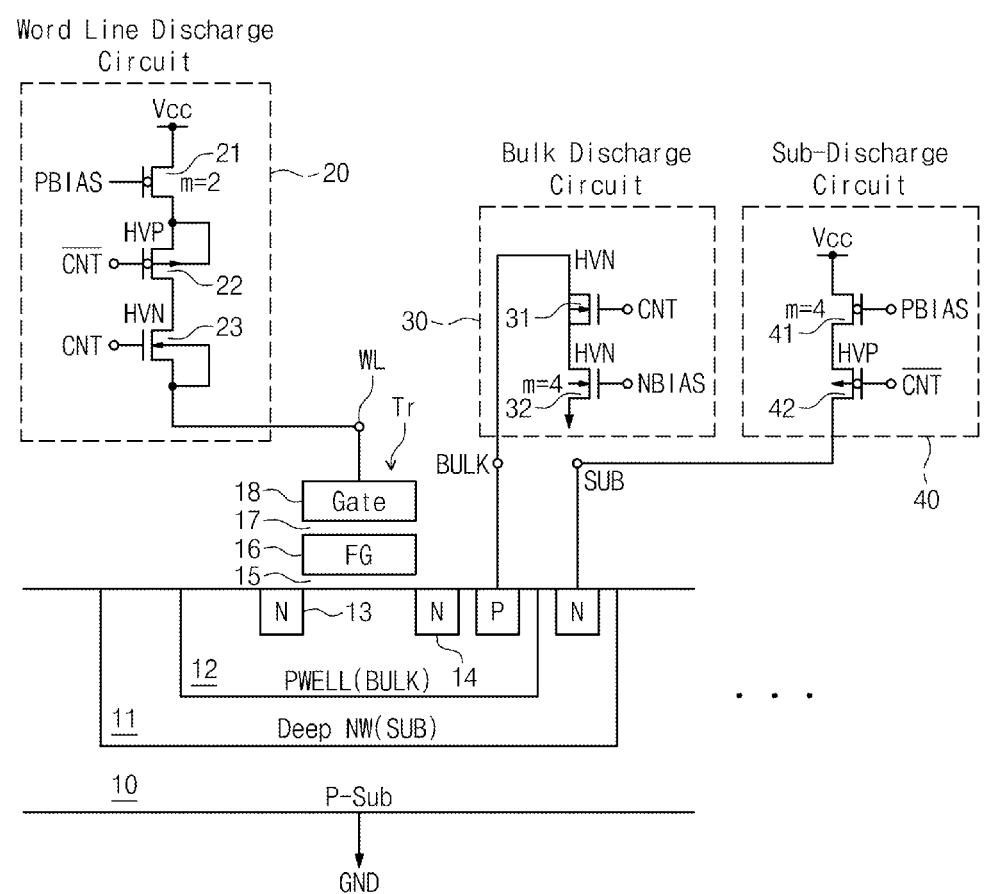
FIG. 1 is a diagram illustrating the configuration of a first discharge circuit according to an embodiment of the inventive concepts.

FIG. 1 is a diagram illustrating the configuration of a discharge circuit according to an embodiment of the inventive concepts.

Figure 7:
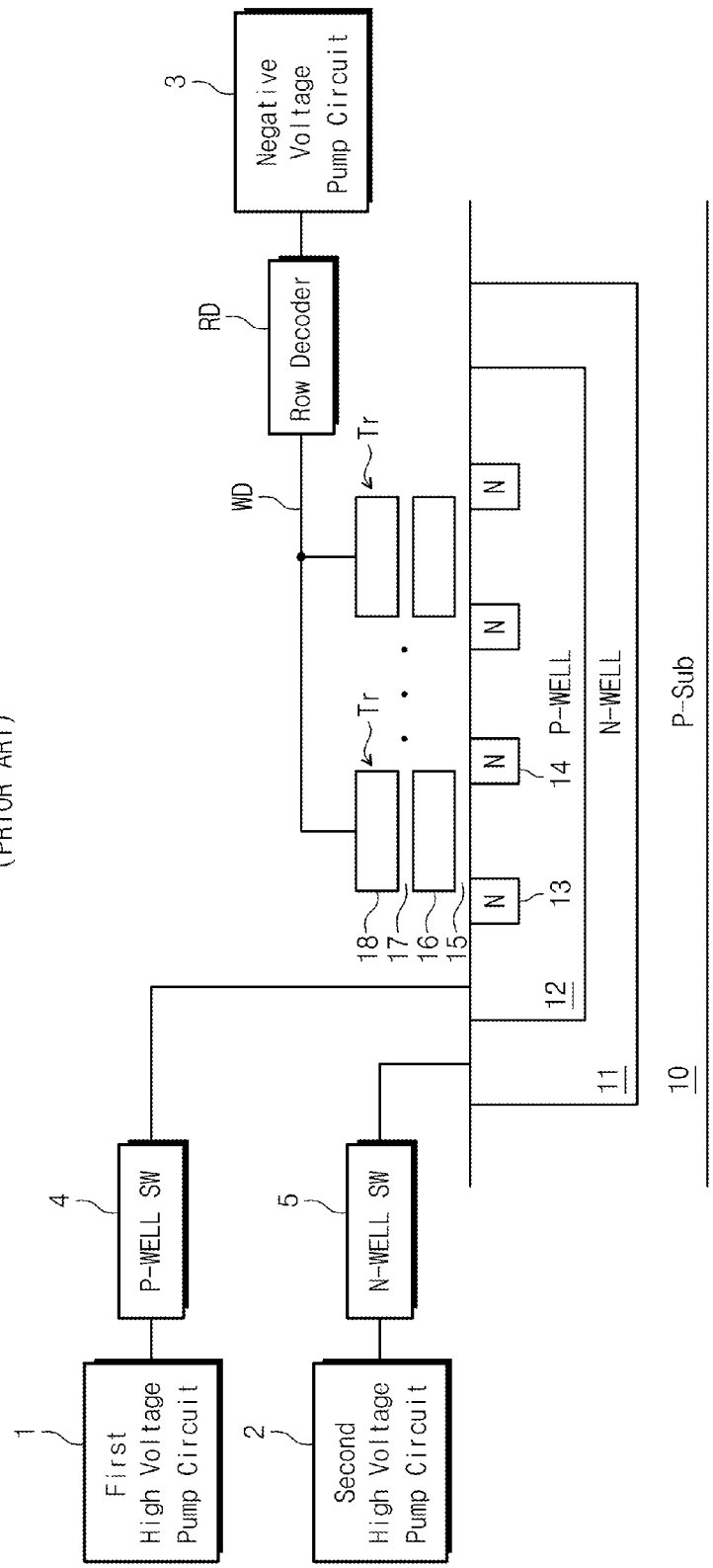
FIG. 7 is a schematic block diagram illustrating a nonvolatile semiconductor memory device of the related art.
Figure 8:
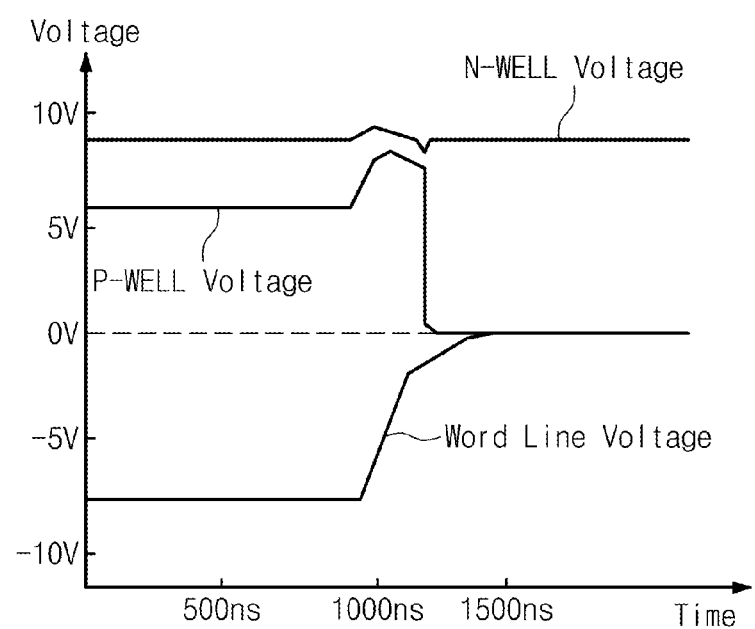
FIG. 8 is a diagram illustrating the discharge characteristic of the nonvolatile semiconductor memory device of FIG. 7.

Referring to FIG. 1, a memory cell array includes a plurality of floating gate type MOS transistors Tr each having a configuration such as that described previously in connection with FIG. 7, and thus their description will be omitted here to avoid redundancy.

A control gate of the floating gate type MOS transistor Tr is connected to a word line terminal WL that is connected to an array region. The word line terminal WL is connected to a word line discharge circuit 20 that is configured with a switching transistor and a constant current transistor which produces a current flow of a given magnitude. A P-well 12 of the floating gate type MOS transistor Tr is connected to a P-well terminal BULK. The P-well terminal BULK is connected to a bulk discharge circuit 30 that is configured with a switching transistor and a constant current transistor which produces a current flow of a given magnitude. The deep N-well 11 of the floating gate type MOS transistor Tr is connected to an N-well terminal SUB. The N-well terminal SUB is connected to a sub-discharge circuit 40 that is configured with a switching transistor and a constant current transistor which produces a current flow of a given magnitude.

More specifically, in the example of the present embodiment, the word line discharge circuit 20 includes a PMOS transistor 21 as a constant current transistor, and a PMOS transistor 22 and an NMOS transistor 23 as switching transistors. The bulk discharge circuit 30 includes an NMOS transistor 31 as a switching transistor and an NMOS transistor 32 as a constant current transistor. The sub-discharge circuit 40 includes a PMOS transistor 41 as a constant current transistor and a PMOS transistor 42 as a switching transistor. Furthermore, m=2 or m=4 that is shown next to the constant current transistors in FIG. 1 indicates the parallel connection number of constant current transistors. That is, m=2 or m=4 may be a parallel number corresponding to the current level of a load discharged. Moreover, the switching transistor has a characteristic compensating function that suppresses the excess rising of the withstand voltage of the constant current transistor.

The one end of the PMOS transistor 21 is connected to a power source terminal Vcc, and the other end of the PMOS transistor 21 is connected to the one end of the PMOS transistor 22. The gate of the PMOS transistor 21 is connected to a constant current bias terminal PBIAS. The other end of the PMOS transistor 22 is connected to the one end of the NMOS transistor 23, and the gate of the PMOS transistor 22 is connected to a switching driving pulse terminal CNTB. The other end of the NMOS transistor 23 is connected to the terminal WL of the control gate 18, and the gate of the NMOS transistor 23 is connected to a switching driving pulse terminal CNT. The one end of the NMOS transistor 31 is connected to the P-well terminal BULK, and the other end of the NMOS transistor 31 is connected to the one end of the NMOS transistor 31. The gate of the NMOS transistor 31 is connected to the switching driving pulse terminal CNT. The other end of the NMOS transistor 32 is connected to a ground terminal GND, and the gate of the NMOS transistor 32 is connected to a constant current bias terminal NBIAS. The one end of the PMOS transistor 41 is connected to the power source terminal Vcc, and the other end of the PMOS transistor 41 is connected to the one end of the PMOS transistor and a gate is connected to the constant current bias terminal PBIAS. The other end of the PMOS transistor 42 is connected to a deep N-well terminal SUB and a gate is connected to the switching driving pulse terminal CNTB.

Figure 2:
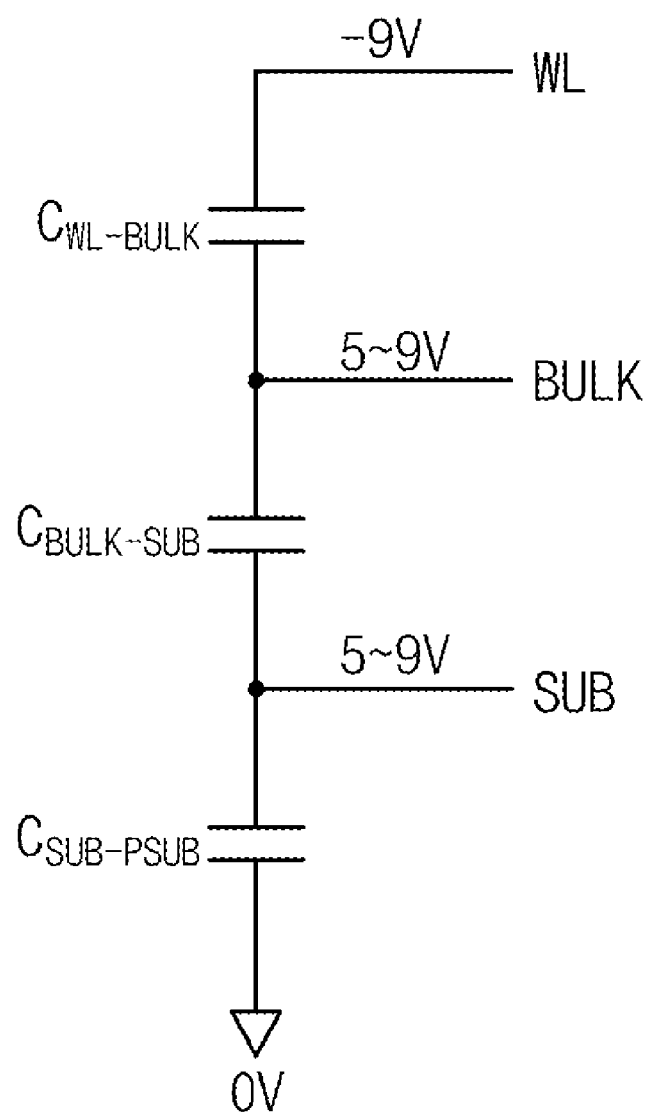
FIG. 2 is a voltage level diagram illustrating a relationship between the terminals of a cell array after erasure.

FIG. 2 is a voltage level diagram illustrating relationship between the terminals of a cell array after erasure.

In modeling a memory array, a capacitance $C_{WL-BULK}$ exists between the word line terminal WL and P-well terminal BULK of the control gate 18. Furthermore, a capacitance $C_{BULK-SUB}$ exists between the P-well terminal BULK and a deep N-well terminal SUB. A capacitance $C_{SUB-PSUB}$ exists between the deep N-well terminal SUB and a ground terminal GND. After an erase operation is ended, in the potential relationships of the capacitances, for example, a voltage of −9 V is applied to the word line terminal WL, a voltage of 5 to 9 V is applied to the P-well terminal BULK, and a voltage of 5 to 9 V is applied to the deep N-well terminal SUB. Because of these, in a discharge process after erasure, electric charges that have been charged in a capacitance between each terminal and the ground terminal GND are discharged. Accordingly, each terminal potential is set to an initial potential in a read operation or an initial potential in a rewriting operation.

Figure 3:
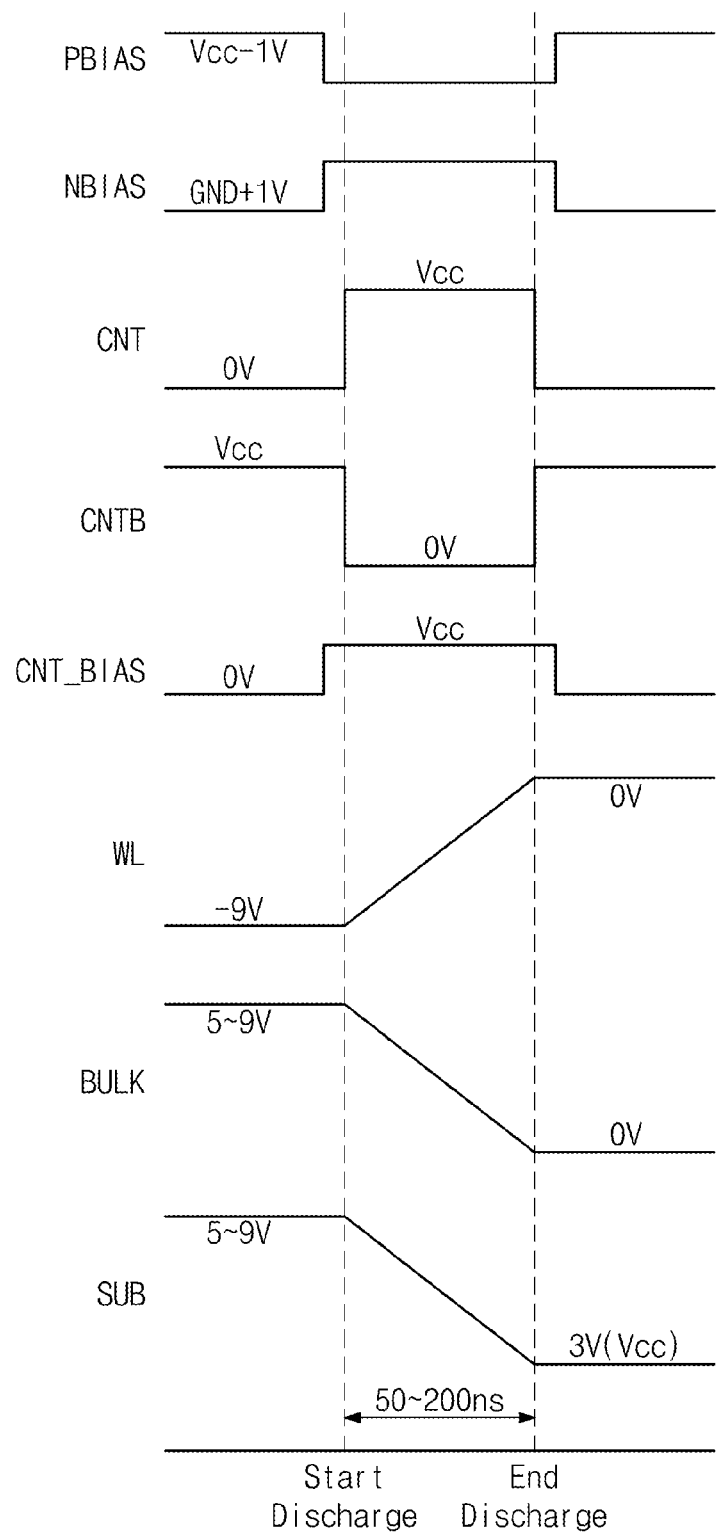
FIG. 3 is a diagram illustrating discharge characteristics by a discharge circuit according to an embodiment of the inventive concepts.

FIG. 3 is a diagram for explaining a discharge characteristic by a discharge circuit according to an embodiment of the inventive concepts.

Referring to FIGS. 1 to 3, in a discharge process, a bias voltage (for example, Vcc−1 V) is always applied from a constant current bias terminal PBIAS to the gate of the PMOS transistor 21 of the word line discharge circuit 20. Accordingly, a stable constant current supply state can be maintained.

A switching driving pulse that shifts from 10 V to 0 V is applied from a switching driving pulse terminal CNTB to the gate of the PMOS transistor 22. The PMOS transistor 22 is turned on by the switching driving pulse. A switching driving pulse that shifts from 0 V to 10 V is applied from a switching driving pulse terminal CNT to the gate of the NMOS transistor 23. Then, the NMOS transistor 23 is also turned on. Consequently, an electric charge is provided from a power source terminal Vcc, and thus the voltage of a terminal WL shifts from −9 V to 0 V.

A bias voltage (for example, GND+1 V) is continuously applied from a constant current bias terminal NBIAS to the gate of the NMOS transistor 31 of the bulk discharge circuit 30. Accordingly, the NMOS transistor 31 maintains a stable constant current supply state. A switching driving pulse that shifts from 0 V to 10 V is applied from a switching driving pulse terminal CNT to the gate of the NMOS transistor 32. The PMOS transistor 22 is turned on by the switching driving pulse. At this point, the NMOS transistor 32 is turned on. Consequently, a P-well terminal BULK is grounded, electric charges are discharged, and thus the voltage of the P-well terminal BULK shifts from 5 to 9 V to 0 V.

A bias voltage (for example, Vcc−1 V) is continuously applied from a constant current bias terminal PBIAS to the gate of the PMOS transistor 41 of the sub-discharge circuit 40. Accordingly, the PMOS transistor 41 maintains a stable constant current supply state. A switching driving pulse that shifts from 10 V to 0 V is applied from the switching driving pulse terminal CNTB to the gate of the PMOS transistor 42. Accordingly, the PMOS transistor 42 is turned on. Consequently, electric charges are discharged, and the voltage of the deep N-well terminal SUB shifts from 5 to 9 V to 3 V. The biases of the constant current bias terminals PBIAS and NBIAS will be described later with reference to FIG. 5.

In this way, a constant current circuit being a criterion is included. In each of the discharge circuits, m is a parallel number corresponding to a load discharged, and a constant discharge time may be maintained. Through the condition of FIG. 2, therefore, a discharge time can be set which is shorter than the typical discharge time of 50 to 200 ns, and the occurrence of latchup can be prevented. In addition, since the design burden is relatively small and a high withstand voltage element is not required, increases in design and manufacturing costs can be avoided. Moreover, when discharge is ended, the voltage of the deep N-well terminal SUB may be applied as 0 V similarly to the voltage of the P-well terminal BULK and be thereafter applied as 3 V. As additional safety measures to avoid latchup, however, the voltage of the deep N-well terminal SUB may be higher than the voltage of the P-well terminal BULK when discharge is ended.

Figure 4:
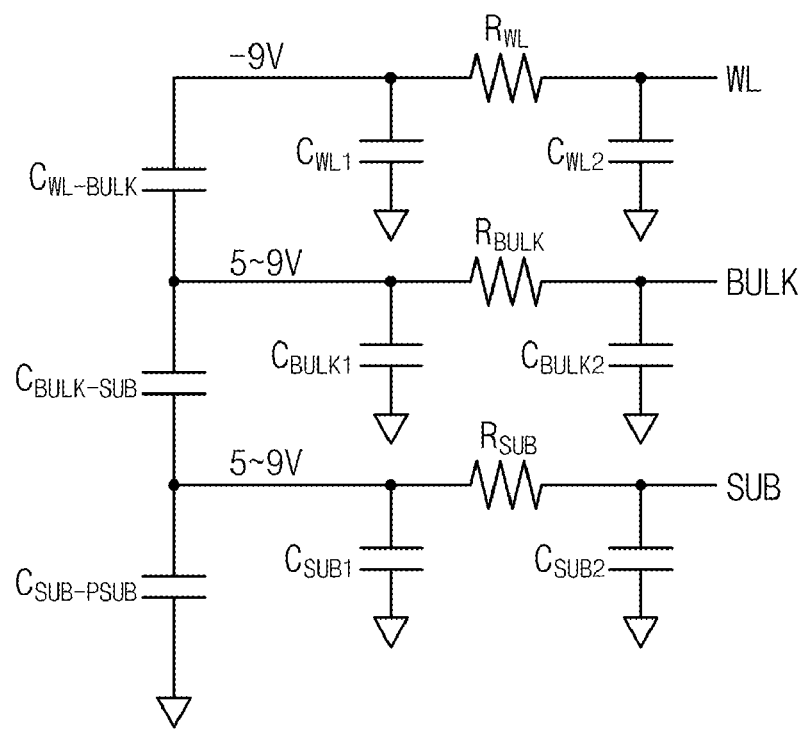
FIG. 4 is a diagram illustrating a model of a cell array load which includes an interconnection distant from a memory cell array.

FIG. 4 is a diagram illustrating a model of a cell array load which includes the interconnection of a memory cell array. An erase operation is performed in sector units. FIG. 2 is a load model when each discharge circuit is disposed near a cell array of a sector unit. For convenience in design, each discharge circuit may be required to be disposed at a location far away from a target erasure sector. In this case, like concentration integers in FIG. 4, a resistor and a parasitic capacitance are added between an erase sector and each discharge circuit. That is, referring to FIG. 4, a resistor $R_{WL}$ is included between an erase sector and the word line discharge circuit 20, and parasitic capacitances $C_{WL1}$ and $C_{WL2}$ are included between the erase sector and the word line discharge circuit 20. A resistor $R_{BULK}$ is included between an erase sector and the bulk discharge circuit 30, and parasitic capacitances $C_{BULK1}$ and $C_{BULK2}$ are included between the erase sector and the bulk discharge circuit 30. A resistor $R_{SUB}$ is included between an erase sector and the sub-discharge circuit 40, and parasitic capacitances $C_{SUB1}$ and $C_{SUB2}$ are included between the erase sector and the sub-discharge circuit 40.

In this way, each discharge circuit may prepare for a minimum erasure unit. However, for convenience in design, the each discharge circuit may be configured with the load model of FIG. 4. In this case, a design, in consideration of each interconnection resistor and interconnection capacitance, is required for the constant current transistor of the each discharge circuit. Moreover, when a plurality of sectors are erased and discharged simultaneously, discharge is performed by simultaneously driving discharge circuits that may be prepared for each sector.

Figure 5:
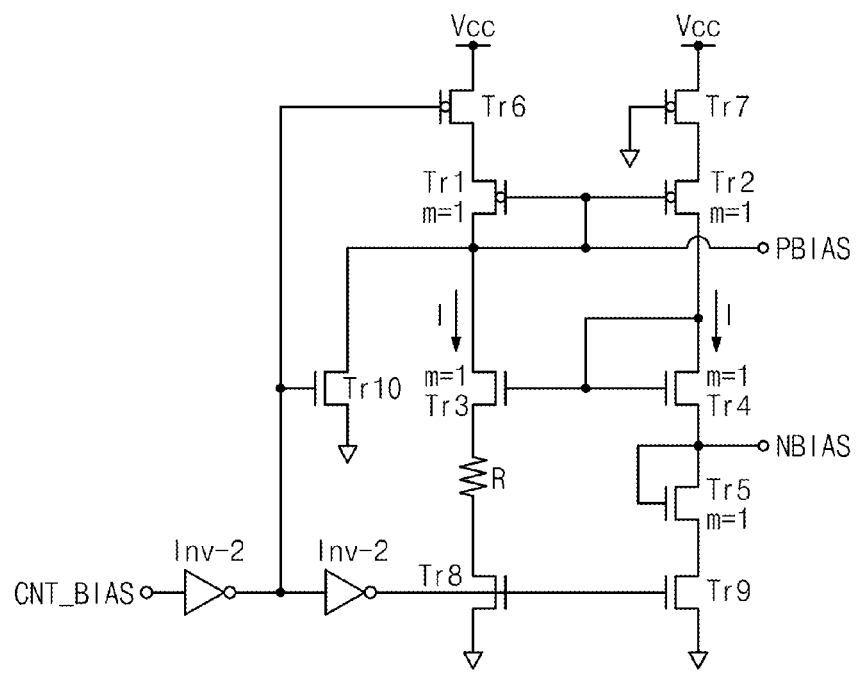
FIG. 5 is a diagram illustrating a bias generation circuit for generating a bias voltage of a constant current transistor.

FIG. 5 is a diagram illustrating an example of a bias generation circuit for generating a bias voltage of a constant current transistor.

Referring to FIG. 5, the one end of a PMOS transistor Tr1 is connected to the one end of a PMOS transistor Tr6. The other end of the PMOS transistor Tr1 is connected to the one end of an NMOS transistor Tr3 and the gate of the NMOS transistor Tr3. The other end of the PMOS transistor Tr1 is connected to the gate of the PMOS transistor Tr2, a constant current bias terminal PBIAS and the one end of an NMOS transistor Tr10. The other end of a PMOS transistor Tr6 is connected to a power source terminal VDD. The other end of the NMOS transistor Tr3 is connected to the one end of a resistor R, and the gate of the NMOS transistor Tr3 is connected to the one end and gate of an NMOS transistor Tr4. The other end of the resistor R is connected to the one end of an NMOS transistor Tr8. The other end of the NMOS transistor Tr8 is connected to a ground terminal GND, and the gate of the NMOS transistor Tr8 is connected to the output terminal of an inverter Inv-2 and the gate of an NMOS transistor Tr9. The input terminal of an inverter Inv-1 is connected to a bias driving terminal CNT_BIAS, and the output terminal of the inverter Inv-1 is connected to the input terminal of the inverter Inv-2, the gate of the PMOS transistor Tr6 and the gate of the NMOS transistor Tr10.

The one end of a PMOS transistor Tr2 is connected to the one end of a PMOS transistor Tr7, and the other end of the PMOS transistor Tr2 is connected to the one end of an NMOS transistor Tr4. The other end of the PMOS transistor Tr7 is connected to the power source terminal VDD. The other end of the NMOS transistor Tr4 is connected to the one end and gate of an NMOS transistor Tr5 and a constant current bias terminal NBIAS. The other end of the NMOS transistor Tr5 is connected to the one end of the NMOS transistor Tr9. The other end of the NMOS transistor Tr9 is connected to the ground terminal GND.

A driving pulse is applied to constant current bias terminals PBIAS and NBIAS like the bias driving terminal CNT_BIAS of FIG. 3, and consequently, a constant current bias pulse is generated.

Currents I of the same magnitude flow in the right and left of the bias generation circuit, respectively. Since the parallel number of transistors configuring the bias generation circuit is m=1, a current of 2*I flows in a discharge circuit when m=2 as a discharge circuit, and a current of 4*I flows in the discharge circuit when m=4 as a discharge circuit. By driving the constant current transistor of each discharge circuit through the bias generation circuit, discharge timing may be performed like in FIG. 3 even when a current flowing in a transistor is shifted according to a change of a manufacturing condition. Accordingly, the voltages of respective terminals WL, BULK and SUB may be maintained as a certain voltage. This is because the voltages of the constant current bias terminals NBIAS and PBIAS is a reference voltage for flowing the same amount of current that is outputted from the same circuit and thus current values discharged from the respective terminals WL, BULK and SUB are simultaneously shifted.

In this way, by generating a voltage for fixing a gate through a independent bias generation circuit, stable and high-reliability discharge can be performed even when a power source voltage is shifted.

Figure 6:
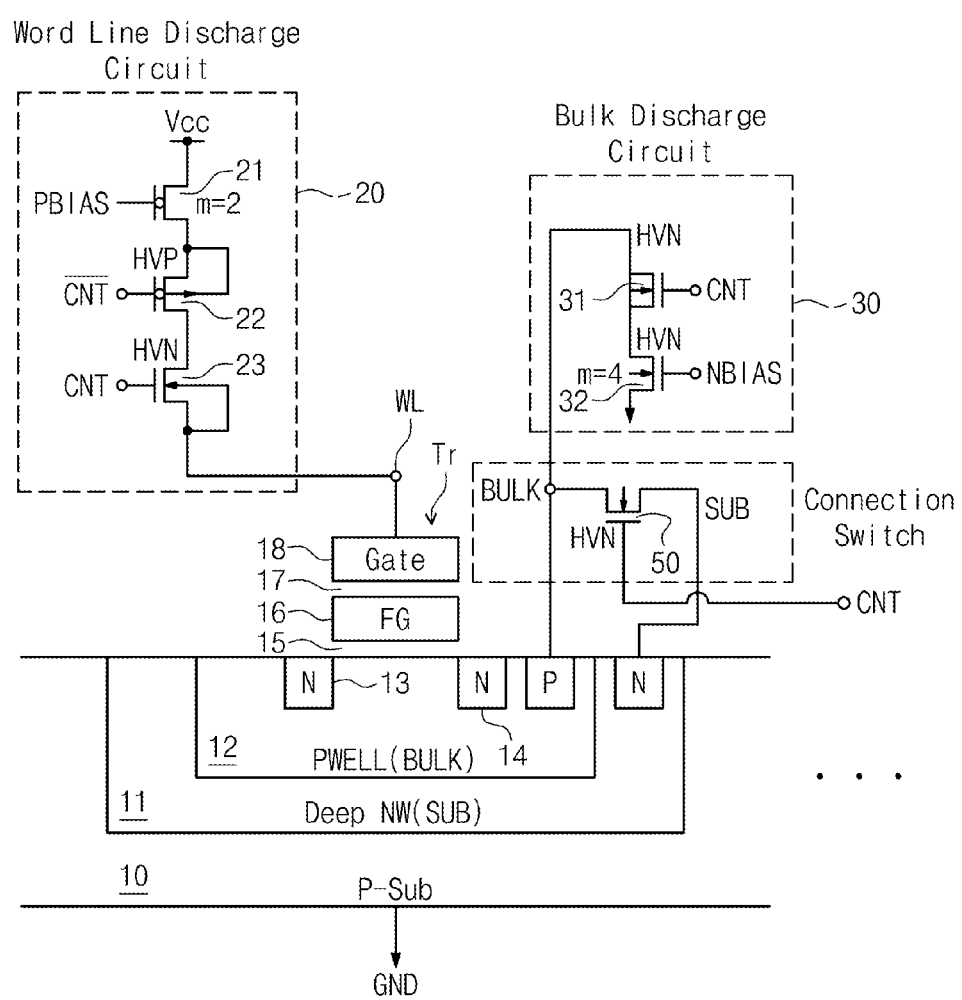
FIG. 6 is a block diagram illustrating a second discharge circuit according to an embodiment of the inventive concepts.

FIG. 6 is a block diagram illustrating a second discharge circuit according to an embodiment of the inventive concept.

Referring to FIG. 6, elements other than a switching transistor 50 configuring a connection switch BULK-SUB are the same as those of FIG. 1, and thus their description will be omitted. As safety measures to latchup, the voltage of a deep N-well terminal SUB may be higher than that of a P-well terminal BULK when discharge is ended. However, when measures to avoid latchup are not required, the voltage of the deep N-well terminal SUB may be maintained as 0 V like the voltage of the P-well terminal BULK. Accordingly, a switching transistor 50 is included between the deep N-well terminal SUB and the P-well terminal BULK, and a switching driving pulse shifting from 0 V to 10 V may be applied from a switching driving pulse terminal CNT to the gate of the switching transistor 50 like in FIG. 1. Then, the deep N-well terminal SUB and the P-well terminal BULK are electrically connected, and the deep N-well terminal SUB shifts to 0 V in timing identical to that of FIG. 1. When compared to the embodiment of FIG. 1, it can be seen that one constant current circuit may be omitted when adopting the embodiment of FIG. 6.

According to embodiments of the inventive concepts, the discharge circuit shortens a discharge time through a constant current circuit for simultaneously discharging the terminals of a memory array and thus can prevent the over of a withstanding voltage and latchup, in a discharge operation after an erase operation. Furthermore, a desired discharge current is obtained by the parallel connection number of the constant current transistors which are a criterion, and thus, provided can be the discharge circuit of the nonvolatile semiconductor memory device that does not accompany the rising of the designing and manufacturing costs.

According to embodiments of the inventive concepts, the discharge circuit of the nonvolatile semiconductor memory device shortens a discharge time and avoids an increase in withstand voltage and latchup through the constant current circuit for simultaneously discharging the terminals of the memory array in a discharge operation after an erase operation, and thus a specific discharge current is obtained by the parallel connection number of the constant current transistors which are a criterion.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A discharge circuit for a floating gate type MOS memory cell transistor having a source, a drain and a control gate connected to a word line, the floating gate type MOS memory cell transistor being disposed in a memory array region of a nonvolatile semiconductor memory device, the memory cell region being formed in P-well, the P-well being formed in an N-well, and the N-well being formed in a P-type semiconductor substrate, the discharge circuit comprising:
a word line discharge circuit including a series connection of a first constant current transistor, a first switching transistor, and a second switching transistor connected between a first power supply voltage and the word line;
a bulk discharge circuit including a series connection of a second constant current transistor and a third switching transistor connected between and a second power supply voltage and the P-well,
wherein each one of the first constant transistor, the second constant transistor, the first switching transistor, the second switching transistor, and the third switching transistor are simultaneously turned ON during at least a portion of a discharge operation.

2. The discharge circuit of claim 1, wherein a first constant current bias voltage is applied to a gate of the first constant current transistor.

3. The discharge circuit of claim 2, wherein a second constant current bias voltage is applied to a gate of the second constant current transistor.

4. The discharge circuit of claim 1, further comprising:
a sub-discharge circuit including a series connection of a third constant current transistor and a fourth switching transistor connected between the first power supply voltage and the N-well.

5. The discharge circuit of claim 3, further comprising:
a bias generation circuit configured to provide the first constant current bias voltage to the gate of the first constant current transistor, and the second constant current bias voltage to the gate of the second constant current transistor.

6. A nonvolatile semiconductor memory device, comprising:
a P-type semiconductor substrate including an N-well;
a P-well formed in the N-well;
a memory cell array region formed in the P-well;
a floating gate type MOS memory cell transistor disposed in the memory cell array region and including a drain and a source formed in the P-well, and a control gate connected to a word line;
a word line discharge circuit including a series connection of a first constant current transistor, a first switching transistor, and a second switching transistor connected between a first power supply voltage and the word line; and
a bulk discharge circuit including a series connection of a second constant current transistor and a third switching transistor connected between and a second power supply voltage and the P-well,
wherein each one of the first constant transistor, the second constant transistor, the first switching transistor, the second switching transistor, and the third switching transistor are simultaneously turned ON during at least a portion of a discharge operation.

7. The nonvolatile semiconductor memory device of claim 6, further comprising:
a sub-discharge circuit including a series connection of a third constant current transistor and a fourth switching transistor connected between the first power supply voltage and the N-well.

8. The nonvolatile semiconductor memory device of claim 7, wherein the fourth switching transistor is connected to a terminal disposed in the N-well and is configured to switch in response to a switching driving pulse; and
the third constant current transistor is configured to supply the first power supply voltage via the fourth the switching transistor, and be turned on simultaneously with the fourth switching transistor.

9. The nonvolatile semiconductor memory device of claim 8, wherein the third constant current transistor is connected to a reference constant current transistor in parallel by a number of transistors corresponding to a target current.

10. The nonvolatile semiconductor memory device of claim 6, wherein the third switching transistor is connected to a terminal disposed in the P-well and is configured to switch in response to a switching driving pulse; and
the second constant current transistor is configured to supply the second power supply voltage via the third the switching transistor and be turned on simultaneously with the third switching transistor.

11. The nonvolatile semiconductor memory device of claim 10, wherein the second constant current transistor is connected to a reference constant current transistor in parallel by a number of transistors corresponding to a target current.

12. A nonvolatile semiconductor memory device, comprising:
a P-type semiconductor substrate including an N-well;
a P-well formed in the N-well;
a memory cell array region formed in the P-well;
a floating gate type MOS memory cell transistor disposed in the memory cell array region and including a drain and a source formed in the P-well, and a control gate connected to a word line;
a word line discharge circuit including a series connection of a first constant current transistor, a first switching transistor, and a second switching transistor connected between a first power supply voltage and the word line;
a bulk discharge circuit including a series connection of a second constant current transistor and a third switching transistor connected between and a second power supply voltage and the P-well; and
a sub-discharge circuit including a connection switch connecting a first terminal disposed in the N-well and a second terminal disposed in the P-well in response to a switching driving pulse,
wherein each one of the first constant transistor, the second constant transistor, the first switching transistor, the second switching transistor, and the third switching transistor are simultaneously turned ON during at least a portion of a discharge operation.

* * * * *